(12) United States Patent
A et al.

(10) Patent No.: US 11,600,989 B2
(45) Date of Patent: Mar. 7, 2023

(54) SMART CAPACITOR

(71) Applicant: SCHNEIDER ELECTRIC USA INC., Boston, MA (US)

(72) Inventors: Pradeep William A, Krishnagiri (IN); Malatesha B. Chakrasali, Bangalore (IN); Ravindra Narayan Kulkarni, Bangalore (IN); Sutanu Basu, Bangalore (IN)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 315 days.

(21) Appl. No.: 16/988,014

(22) Filed: Aug. 7, 2020

(65) Prior Publication Data

US 2021/0210950 A1  Jul. 8, 2021

Related U.S. Application Data

(60) Provisional application No. 62/958,324, filed on Jan. 8, 2020.

(51) Int. Cl.
*H02H 7/16* (2006.01)
*G01R 31/64* (2020.01)
(Continued)

(52) U.S. Cl.
CPC .......... *H02H 7/16* (2013.01); *G01R 19/1659* (2013.01); *G01R 31/64* (2020.01); *H02H 1/0007* (2013.01); *H02M 1/4216* (2013.01)

(58) Field of Classification Search
CPC ...... H02H 7/16; H02H 1/0007; H02M 1/4216
See application file for complete search history.

(56) References Cited

U.S. PATENT DOCUMENTS 4,330,777 A    5/1982  McDuff
4,425,541 A *  1/1984  Burkum ................. G01R 31/50
                                                 324/529
(Continued)

FOREIGN PATENT DOCUMENTS

EP    2439547 A1    4/2012
EP    3070804 A1    9/2016
(Continued)

OTHER PUBLICATIONS

Extended European Search Report from corresponding European Application No. 20209330.8 dated May 18, 2021.

*Primary Examiner* — Adolf D Berhane
*Assistant Examiner* — Afework S Demisse
(74) *Attorney, Agent, or Firm* — Lando & Anastasi, LLP

(57) ABSTRACT

Methods and systems include identifying an abnormal condition in a PFC circuit comprising an input configured to be coupled to a 3-phase power source and to receive input 3-phase power from the 3-phase power source, a bus having a plurality of bus lines, each bus line configured to be coupled to the input and to carry one phase of the input 3-phase power, a PFC leg including a contactor configured to selectively couple a capacitor bank included in the PFC leg to the bus. In response to identifying the abnormal condition, the contactor is controlled to decouple the capacitor bank from the bus, and after a reset button has been activated, the contactor is recoupled to the capacitor bank to resume operating the PFC leg to provide power factor correction to the input 3-phase power.

20 Claims, 8 Drawing Sheets

(51) Int. Cl.
*G01R 19/165* (2006.01)
*H02H 1/00* (2006.01)
*H02M 1/42* (2007.01)

(56) References Cited

U.S. PATENT DOCUMENTS

| | | | | |
|---|---|---|---|---|
| 4,540,935 | A | * | 9/1985 | Burkum ................ G01R 31/50 |
| | | | | 324/548 |
| 4,864,242 | A | * | 9/1989 | Hurley ................ G01R 31/346 |
| | | | | 324/545 |
| 10,330,725 | B2 | | 6/2019 | Tuckey et al. |
| 2009/0231764 | A1 | | 9/2009 | Banting et al. |
| 2014/0285969 | A1 | | 9/2014 | Kojima et al. |

FOREIGN PATENT DOCUMENTS

| | | |
|---|---|---|
| EP | 3264121 A1 | 1/2018 |
| WO | 2013040490 A1 | 3/2013 |
| WO | 2014098800 A1 | 6/2014 |

* cited by examiner

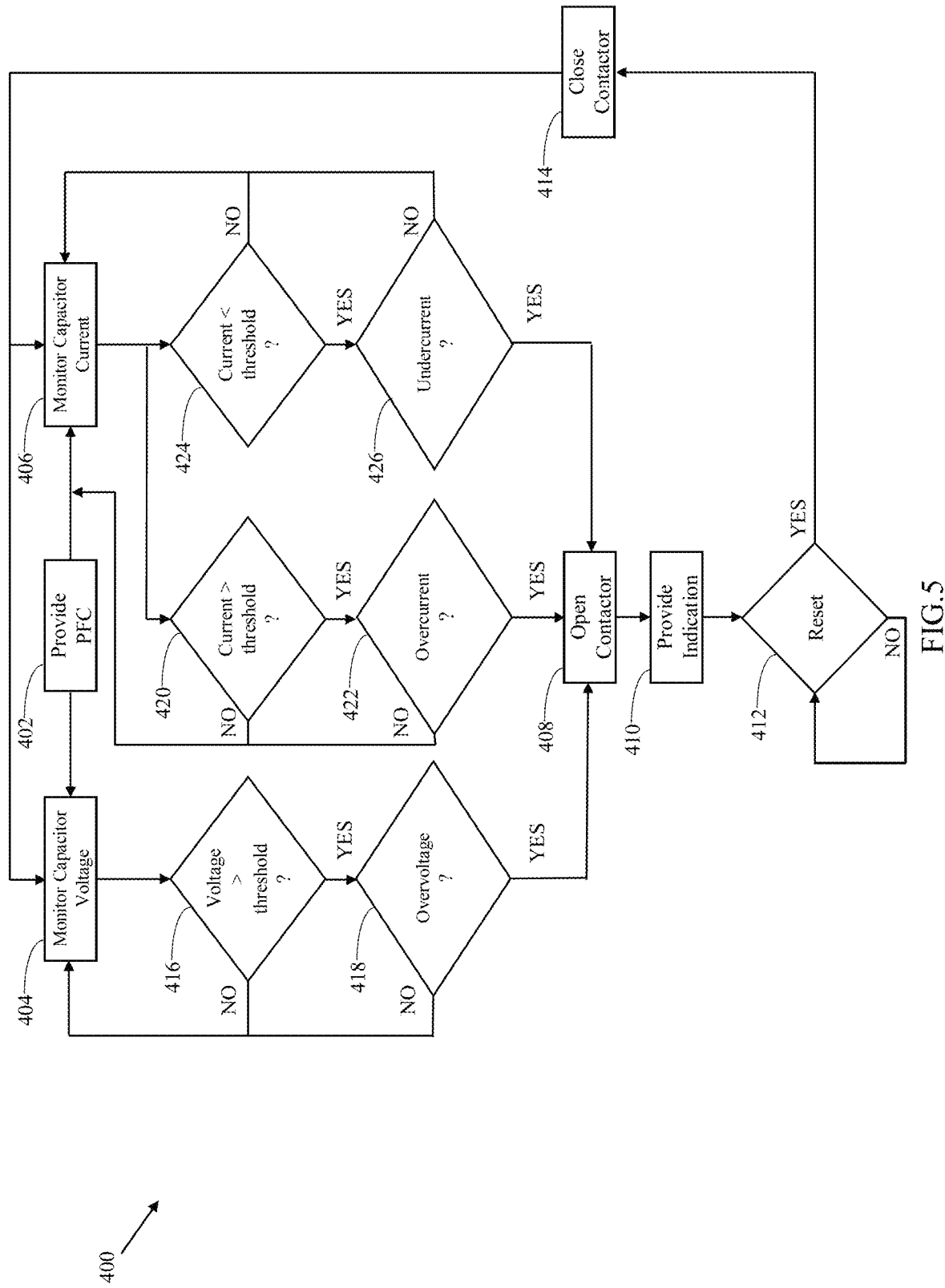

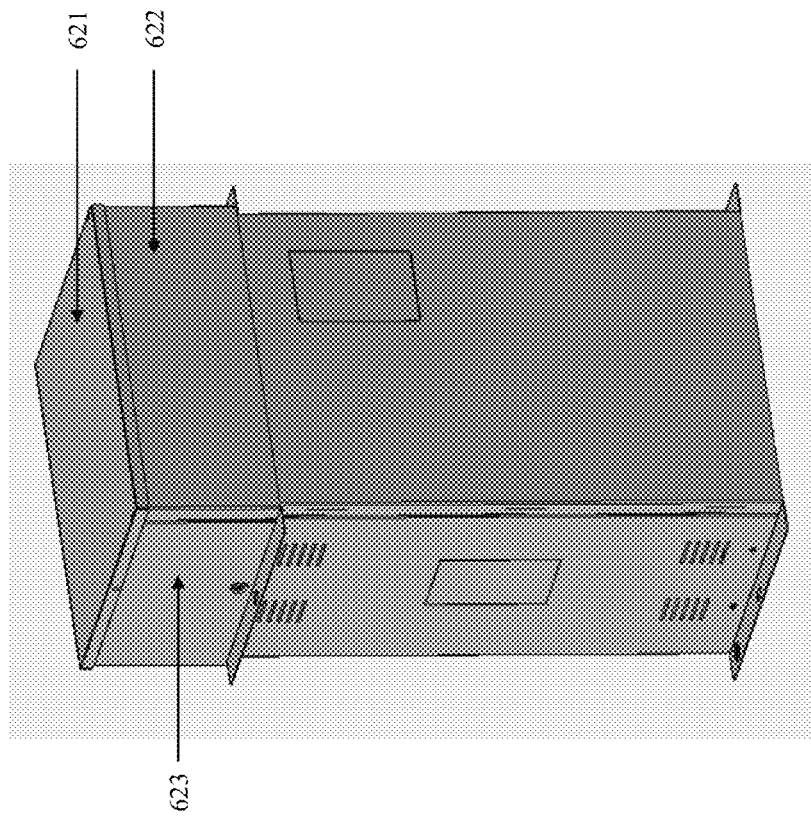
FIG.6A

SMART CAPACITOR

CROSS REFERENCE TO RELATED APPLICATIONS

This application claims priority under 35 USC § 119(e) to U.S. Provisional Patent Application Ser. No. 62/958,324, titled "SMART CAPACITOR," filed Jan. 8, 2020, which is incorporated by reference herein in its entirety for all purposes.

BACKGROUND

Field

Embodiments generally relate to three-phase Power Factor Correction (PFC) circuits.

Discussion of Related Art

Power factor, the ratio between the real power and the apparent power drawn by electrical loads coupled to a power system, can be utilized as a measure of the efficiency of the power system. For example, in an ideal system, the power factor is close to unity. Power Factor Correction (PFC) systems can be utilized in a power system to raise power factor of the system closer to unity in order to improve efficiency of the system.

Three-phase power systems typically include PFC equipment that is configured to apply power factor correction to received 3-phase input power to reduce reactive power requirements and associated losses. Such PFC equipment commonly includes switching circuitry that is operated by a controller, in conjunction with a capacitor bank, to provide the power factor correction.

SUMMARY

Aspects and embodiments are directed to a capacitor system comprising a housing, the housing including at least one capacitor configured to be coupled to at least one bus line, at least one sensor configured to measure at least one electrical parameter of the at least one capacitor; and a monitoring device configured to monitor the at least one electrical parameter, identify one or more conditions of the at least one capacitor based on the at least one electrical parameter, and operate a contactor to decouple the at least one capacitor from the at least one bus line in response to identifying the one or more conditions.

According to one embodiment, the at least one sensor includes a voltage sensor coupled to the at least capacitor and the at least one parameter includes a voltage across the at least one capacitor. In some embodiments the one or more conditions include the voltage exceeding a predetermined value. In additional embodiments the one or more conditions include the voltage exceeding the predetermined value for one of at least a number of samples and at least a period of time.

According to another embodiment, the at least one sensor includes a current sensor coupled to the at least one capacitor and configured to measure current provided to the at least one capacitor. In some embodiments the one or more conditions include the current exceeding a predetermined value. In additional embodiments the one or more conditions include the current exceeding the predetermined value for one of at least a number of samples and at least a period of time. In other embodiments, the one or more conditions include the current being less than a second predetermined value for one of at least a number of samples and at least a period of time.

According to one embodiment, in operating the contactor to decouple the at least one capacitor from the at least one bus, the monitoring device is further configured to, in response to identifying the one or more conditions, transmit a signal through one or more of a wired or wireless connection to a controller to operate the contactor to decouple the system from the at least one bus line.

According to another embodiment, the system further comprises a trip indicator including a reset button configured to be activated to recouple the at least one capacitor to the at least one bus line and continue monitoring for the one or more conditions, and the monitoring device is further configured to transmit a signal to the trip indicator in response to identifying the one or more conditions.

According to one embodiment, the at least one sensor includes a voltage sensor coupled to the at least one capacitor and configured to measure a voltage across the at least one capacitor, and a current sensor coupled to the at least one capacitor and configured to measure current provided to the at least one capacitor, the at least one parameter includes the voltage and the current, and the one or more conditions include an overvoltage, an overcurrent, and an undercurrent. The monitoring device is further configured to detect the voltage exceeds the predetermined value for one of at least a number of samples and at least a period of time, and identify the overvoltage, detect the current exceeds a second predetermined value for one of at least a number of samples and at least a period of time, and identify the overcurrent, and detect the current is less than a third predetermined value for one of at least a number of samples and at least a period of time, and identify the undercurrent.

Aspects and embodiments are directed to a method of operating a capacitor system including a housing, the housing including at least one capacitor, at least one sensor, and a monitoring device. The method comprises coupling the at least one capacitor to at least one bus line, coupling the at least one capacitor to the at least one sensor, measuring, with the at least one sensor, at least one electrical parameter of the at least one capacitor, monitoring, with the monitoring device, the at least one electrical parameter, identifying one or more conditions of the at least one capacitor based on the at least one electrical parameter, and operating a contactor to decouple the at least one capacitor from the at least one bus line in response to identifying the one or more conditions.

According to one embodiment, the method further comprises coupling the at least one sensor to the at least one capacitor. Measuring the at least one parameter includes measuring a voltage across the at least one capacitor, determining the voltage exceeds a predetermined value for one of at least a number of samples and at least a period of time, and identifying the one or more conditions includes identifying an overvoltage.

According to another embodiment, the method further comprises coupling the at least one sensor to the at least one capacitor, measuring the at least one parameter includes measuring a current provided to the at least one capacitor, determining the current exceeds a predetermined value for one of at least a number of samples and at least a period of time, and identifying the one or more conditions includes identifying an overcurrent.

According to one embodiment, the method further comprises coupling the at least one sensor to the at least one capacitor, measuring the at least one parameter includes measuring a current provided to the least one capacitor, determining the current is less than a predetermined value for one of at least a number of samples and at least a period of time, and identifying the one or more conditions includes identifying an undercurrent.

According to another embodiment, operating the contactor to decouple the at least one capacitor from the at least one bus further comprises, in response to identifying the one or more conditions, transmitting a signal through one or more of a wired or wireless connection to a controller, and operating, with the controller, the contactor to open in response to receiving the signal.

According to one embodiment, the method further comprises, in response to identifying the one or more conditions, transmitting a signal to a trip indicator included in the capacitor system, the trip indicator including a reset button, in response to receiving the signal, activating the trip indicator, and in response to the reset button being activated, recoupling the smart capacitor system to the at least one bus and continuing to monitor for the one or more conditions.

Aspects and embodiments are directed to a Power Factor Correction (PFC) circuit comprising a controller, an input configured to be coupled to a 3-phase power source and to receive input 3-phase power from the 3-phase power source, at least one bus configured to carry the input 3-phase power, a PFC leg including a contactor configured to be coupled to a capacitor system, the contactor coupled to the controller and configured to couple the PFC leg to the at least one bus, the capacitor system including a housing. The housing includes at least one capacitor configured to be coupled to the at least one bus line, at least one sensor configured to measure at least one electrical parameter of the at least one capacitor, and a monitoring device configured to monitor the at least one electrical parameter, identify one or more conditions of the at least one capacitor based on the at least one electrical parameter, and transmit a signal to the controller to operate the contactor to decouple the at least one capacitor from the at least one bus line based on identifying the one or more conditions.

According to one embodiment, the PFC circuit further comprises a trip indicator including a reset button configured to be activated to recouple the at least one capacitor to the at least one bus line and continue monitoring for the one or more conditions, and the monitoring device is further configured to transmit a signal to the trip indicator in response to identifying the one or more conditions.

According to another embodiment, the at least one sensor includes a voltage sensor coupled to the at least one capacitor and configured to measure a voltage across the at least one capacitor, and a current sensor coupled to the at least one capacitor and configured to measure current provided to the at least one capacitor, the at least one parameter includes the voltage and the current, the one or more conditions include an overvoltage, an overcurrent, and an undercurrent, and the monitor is further configured to detect the voltage exceeds the predetermined value for one of at least a number of samples and at least a period of time, and identify the overvoltage, detect the current exceeds a second predetermined value for one of at least a number of samples and at least a period of time, and identify the overcurrent, and detect the current is less than a third predetermined value for one of at least a number of samples and at least a period of time, and identify the undercurrent.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 5 is a flow chart illustrating operation of monitoring power factor correction in accordance with aspects and embodiments described herein;

FIG. 6A is an illustration of a box-type capacitor in accordance with aspects and embodiments described herein;

DETAILED DESCRIPTION

Figure 1:
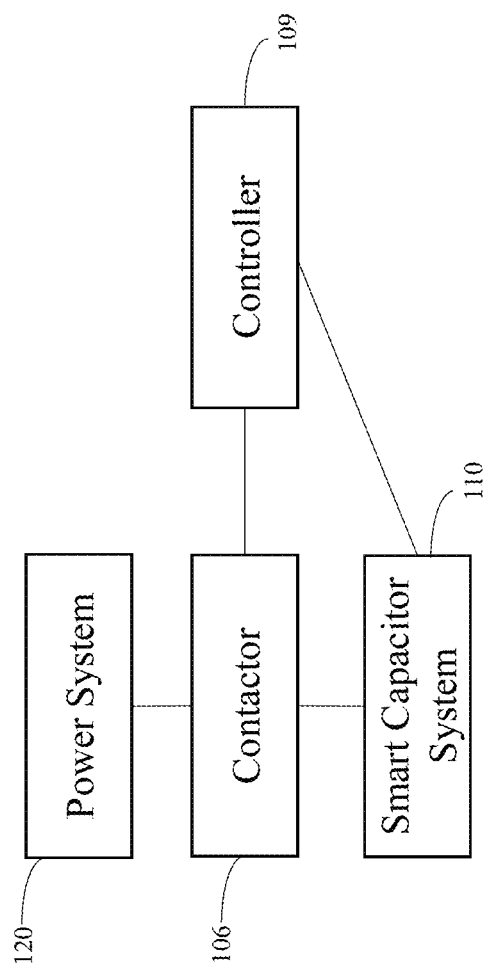
FIG. 1 is a block diagram including a power system, contactor, controller, and smart capacitor system in accordance with aspects and embodiments described herein.

It is to be appreciated that embodiments of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples. Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms in this document and documents incorporated herein by reference, the term usage in the incorporated features is supplementary to that of this document; for irreconcilable differences, the term usage in this document controls.

As described above, a power factor correction circuit of a three-phase power system typically includes switching circuitry that is operated by a controller, in conjunction with a capacitor bank, to provide power factor correction to received input three-phase power. However, abnormal voltage and/or current conditions received by the power factor correction circuit and capacitor bank may have a negative impact on capacitors in the capacitor bank. For example, an abnormal condition such as an overvoltage or overcurrent condition can reduce the lifetime of the capacitors in the capacitor bank. In addition, a resulting loss of capacitance of the capacitors in the capacitor bank can cause an undercurrent condition which can reduce efficiency of the system and/or affect operation of a corresponding load.

Aspects and embodiments describe herein are related to a smart capacitor system capable of detecting an abnormal voltage and/or current condition of a capacitor in the system, and as a result, operating a contactor to prevent power flow to the capacitor. By preventing power flow from the contactor to the capacitor in response to detecting an abnormal condition, the lifetime of the capacitor can be preserved and the efficiency of the system can be maintained.

An example of such a smart capacitor system 110 in a configuration of connected components is illustrated in FIG. 1. This configuration includes a power system 120, at least one contactor 106, and a controller 109. The power system 120 is configured to be connected to the contactor 106, which is configured to be coupled to the smart capacitor system 210. The controller 109 can be connected to the contactor 106 and/or the smart capacitor system 110. When in use, the power system 120 can store energy in one or more internal capacitors of the capacitor system 210. The smart capacitor 110 110 monitors parameters of the one or more internal capacitors and either operates directly, or instructs the controller 109 to operate, the contactor 106 to decouple the smart capacitor 110 from the power system 120 in response to certain conditions.

Figure 2:
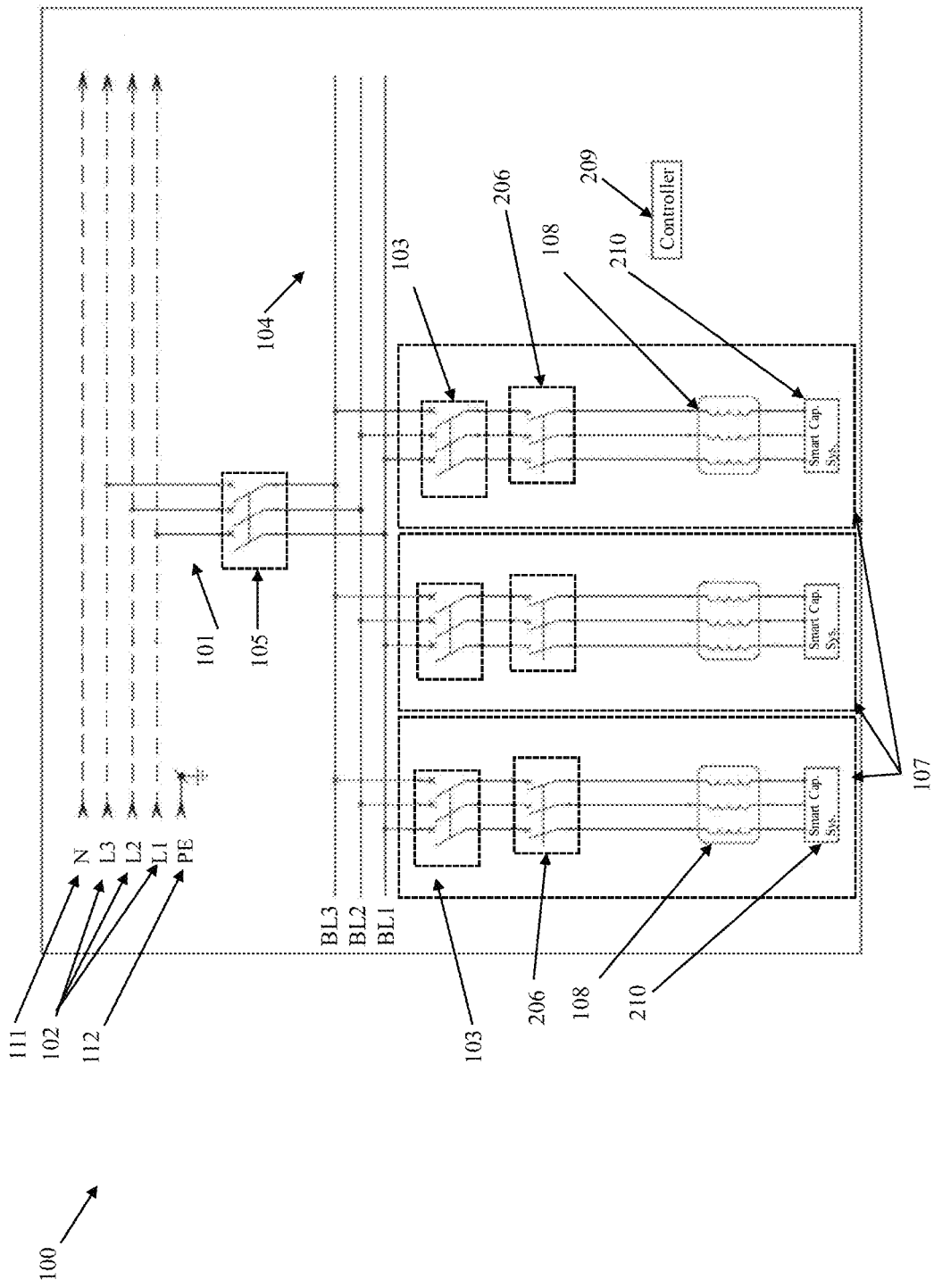
FIG. 2 is a schematic diagram of a PFC circuit including a capacitor system in accordance with aspects and embodiments described herein.

Capacitor systems described herein can be utilized in a PFC circuit. For example, FIG. 2 is a schematic diagram of a PFC circuit 100 according to embodiments described herein. The PFC circuit 100 includes an input 101, input power lines 102, a bus 104, an input circuit breaker 105, a controller 209 (e.g., similar to the controller 109 in FIG. 1), an input neutral line (N), an input ground line (PE), and at least one PFC leg 107, each PFC leg 107 including a circuit breaker 103, a leg contactor 206 (e.g., similar to the contactor 106 in FIG. 1), an inductor bank 108, and a smart capacitor system 210 (e.g., similar to the smart capacitor system 110 in FIG. 1). As shown in FIG. 1, the PFC circuit 100 includes three PFC legs 107; however, in other embodiments, the PFC circuit 100 includes more or fewer than three PFC legs 107. The input lines 102 include three input phase lines (L1, L2, L3). Each PFC leg 107 is configured to be coupled to the bus 104.

The input 101 of the PFC circuit 103 is configured to be coupled to a 3-phase power source via input power lines 102 and to receive input 3-phase power from the 3-phase power source. Each input power line 102 configured to carry one phase of the input 3-phase power. The input circuit breaker 105 of the PFC circuit 103 is configured to selectively couple each input power line 102 to a corresponding bus line (BL1, BL2, BL3) of the bus 104, via the input 101.

The PFC leg circuit breaker 103 is configured to be coupled to each bus line (BL1, BL2, BL3) of the bus 104 and the leg contactor 206. Each leg contactor 206 is configured to selectively couple each bus line (BL1, BL2, BL3) of the bus 104 to the capacitor system 210 via a corresponding inductor in the inductor bank 108. As shown in FIG. 1, each PFC leg 107 includes one leg contactor 206; however, in other embodiments, each PFC leg 107 can include more than one leg contactor 206. The controller 209 is coupled to the capacitor system 210 and leg contactor 206 of each PFC leg 107. In some embodiments, the capacitor system 210 is in communication with the controller 209 to indicate abnormal voltage and/or current conditions of the capacitor system 210.

As similarly described above, the PFC circuit 100 is operated by the controller 209 to provide power factor correction to the input 3-phase power received by the input lines 102. By selectively coupling desired PFC legs 107 to the bus 104, the controller 209 can operate the PFC circuit 100 to provide desired power factor correction to the received input 3-phase power.

The capacitor system 210 of each PFC leg 107 is configured to monitor voltage across the capacitor system 210 and/or current provided to the capacitor system 210 and, as a result, detect abnormal voltage and/or current conditions. In response to detecting an abnormal voltage and/or current condition at the capacitor system 210, the capacitor system can generate a signal indicating as such.

According to one embodiment, the capacitor system 210 provides the signal indicating the abnormal voltage and/or current condition to the controller 209. In response to receiving a signal from the capacitor system 210 indicating an abnormal voltage and/or current condition, the controller 209 operates a leg contactor 206 of the PFC leg 107 within which the abnormal condition was detected to open such that the PFC leg 107 (and corresponding capacitor system 210) is decoupled from the bus 104. In another embodiment, the capacitor system 210 can directly operate a corresponding leg contactor 206 to open, thereby decoupling the capacitor system 210 from the bus 104.

By decoupling the capacitor system 210 from the bus 104 (and preventing power flow to/from the capacitor system 210) in response to a detected abnormal voltage and/or current condition, the lifetime of capacitors in the capacitor system 210 can be preserved and the efficiency of the PFC circuit 100 can be maintained.

Figure 3:
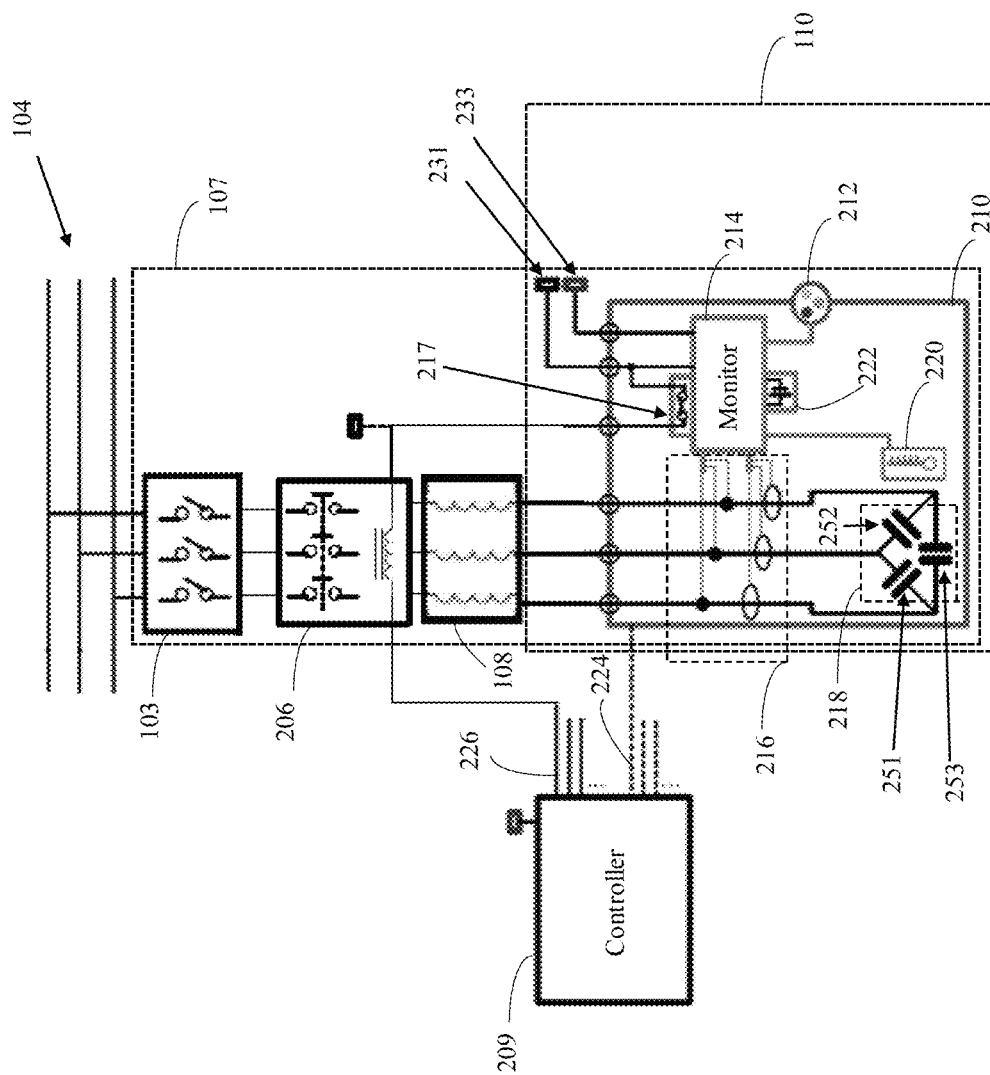
FIG. 3 is a schematic diagram of a PFC leg coupled to a bus.

FIG. 3 is a schematic diagram of one embodiment of the capacitor system 210 in one of the PFC legs 107 in accordance with aspects described herein. As illustrated in FIG. 2, the capacitor system 210 includes control power lines 231, 233, and a housing 210. Within the housing 210, the capacitor system 210 includes a trip indicator 212 (e.g., a visual or audible alarm), a monitoring device 214, a relay 217, a capacitor bank 218 including a plurality of capacitors 251,252,253, a temperature sensor 220, a battery 222, and a sensor package 216. In one embodiment, the capacitors of the capacitor bank 218 are oriented in a delta configuration; however, in other embodiments, the capacitors may be configured differently.

The battery 222 is coupled to the monitoring device 214 and is configured to supply power to the monitoring device 214.

The control power lines 231,233 are configured to provide power to the monitoring device 214. In the event of one or more of the capacitors 251,252,253 being disconnected from a supply line, the power provided by the control power lines 231,233 can keep the monitoring device 214 powered and running to perform one or more operations including blinking indicator lights, communicating with externally connected devices, logging data, and holding or changing the state of the relay 217.

As illustrated in FIG. 3, the sensor package 216 includes three voltage sensors (shown as solid black dots) and three current transformers (shown as ovals). Each sensor in the sensor package 216 is coupled to the monitoring device 214. A pair of sensors (one current sensor and one voltage sensor) is coupled to each of three capacitors 251,252,253 in the capacitor bank 218. One terminal of the first capacitor 251 is coupled to a node shared by a terminal of the third capacitor 253, the node being coupled to a first pair of sensors (one voltage sensor and one current sensor). Another terminal of the first capacitor 251 is coupled to a node shared by a terminal of the second capacitor 252, the node being coupled to a second pair of sensors (one voltage sensor and one current sensor). Another terminal of the second capacitor 252 is coupled to a node shared by another terminal of the third capacitor 253, the node being coupled to a third pair of sensors (one voltage sensor and one current sensor).

Other configurations of sensors are contemplated. In an example, the housing 210 includes only current sensors coupled to the capacitor bank 218. In another example, the housing 210 includes only voltage sensors coupled to the capacitor bank.

As shown in FIG. 3, the capacitors 251,252,253 are in a delta configuration. However, in other embodiments, the capacitors 251,252,253 can be configured differently. For example, in one embodiment, the capacitors 251,252,253 are configured in a star configuration such that a terminal of each capacitor is coupled to a central node. Some examples include only current sensors. Other examples include only voltage sensors.

As shown in FIG. 3, the voltage sensors are coupled to each capacitor 251,252,253 and are configured to monitor the voltage across each capacitor 251,252,253. The current sensors are coupled to each capacitor 251,252,253 and are configured to monitor the current provided to each capacitor 251,252,253. In at least one embodiment, in response to detecting an abnormal voltage (e.g., an overvoltage or an undervoltage) and/or current condition (e.g., an overcurrent or an undercurrent) at the capacitors 251,252,253, the monitoring device 214 transmits a signal to the controller 209 indicating as such. In one embodiment, the monitoring device 214 communicates wirelessly with the controller 209. In another embodiment, the monitoring device 214 communicates with the controller 209 via a wired connection (e.g., a serial communication bus, not shown).

According to one embodiment, the monitoring device 214 identifies an abnormal condition upon sensing a voltage across one or more of the capacitors 251,252,253 above a threshold level (i.e., an overvoltage condition). In another embodiment, the monitoring device 214 identifies an abnormal condition upon sensing current to one or more of the capacitors 251,252,253 above a threshold level (i.e., an overcurrent condition). In another embodiment, the monitoring device 214 identifies an abnormal condition upon sensing current to one or more of the capacitors 251,252,253 below a threshold level (i.e., an undercurrent condition). According to one embodiment, in response to identifying an abnormal condition, the monitoring device 214 transmits a signal identifying as such to the controller 209, which is external the housing 210, and the controller 209 operates the leg contactor 206, which is also external to the housing 202 of the monitoring device 214, to decouple the corresponding PFC leg 107 from the bus 104. In another embodiment, in response to identifying the abnormal condition, the monitoring device 214 operates the leg contactor 206 directly through one of a wired or wireless connection, thereby opening the leg contactor 206.

In at least one embodiment, the controller 209 is configured to control the leg contactor (contactor) 206 via one or more of the signal lines 226. The leg contactor 206 includes an inductor that is configured to generate a magnetic field capable of operating one or more contact switches within the contactor 206. For example, when a voltage is applied to a terminal of the inductor of the leg contactor 206 via the one or more signal lines 226, a magnetic field is generated by the inductor that operates one or more contact switches within the leg contactor 206 to change from one state to another (e.g., open to closed, or closed to open), thereby decoupling the PFC leg 107 from the bus 104.

In addition, the controller 209 can be coupled to any one or more components within the housing 210 via the one or more signal lines 224. For example, in one embodiment, the controller 209 is coupled to the monitoring device 214 via the one or more signal lines 224 and is configured to communicate (bi-directionally and/or unidirectionally) with the monitor 214 via the signal lines 224. In one embodiment, the signal lines 224 provide a wired connection (e.g., a serial communication bus. The signal lines may alternatively or in addition be a wireless connection (e.g., a particular radio frequency, Wi-Fi, or Bluetooth).

Upon receiving a signal from the monitoring device 214 indicating an abnormal condition, the controller 209 operates the leg contactor 206 of the PFC leg 107 within which the abnormal condition was detected to open such that the PFC leg 107 (and corresponding capacitors in the capacitor bank 218) is decoupled from the bus 104. Such overvoltage, overcurrent, or undercurrent conditions, as described above, can reduce the lifetime of the capacitors 251,252,253 and reduce efficiency of the capacitor system 210 in the housing 210. Accordingly, by decoupling the capacitors 251,252,253 from the bus 104 in response to a detected abnormal voltage and/or current condition, the lifetime of the capacitors 251,252,253 can be preserved. When incorporated into a PFC circuit, including the PFC circuit 100 illustrated in FIG. 1, such decoupling maintains efficiency of the PFC circuit.

Additional embodiments include the monitoring device 214 controlling, in response to identifying an abnormal condition, the leg contactor 206 directly via a signal line without first communicating with the controller 209. For example, in some embodiments, the monitoring device 214 is configured to control the leg contactor 206 directly via the relay 217 by closing the relay 217 such that a voltage is applied to the inductor of the leg contactor 206 to generate a magnetic field that operates one or more contact switches within the leg contactor 206 to decouple the PFC leg 107 from the bus 104.

According to one embodiment, the monitoring device 214 is further configured to monitor ambient temperature of the housing 210. The temperature sensor 220 is coupled to the monitoring device 214 and is configured to measure a temperature within the housing 210. The monitoring device 214 is configured to identify an abnormal condition based on the monitored temperature. In some embodiments, the temperature sensor 220 is within the housing 210, as illustrated in FIG. 2. In other embodiments, the monitored temperature is external to the housing 210 (not shown). According to certain embodiments, the controller 209 or the monitoring device 214 is configured to obtain a temperature value from the temperature sensor 220, compare the value to a predetermined threshold, and determine an abnormal condition. In an example, in response to the temperature sensor 220 measuring a value exceeding the predetermined threshold, the leg contactor 206 is controlled to decouple the PFC leg 107 from the bus 104. The trip indicator 212 is configured to activate in response to the monitoring device 214 and/or the controller 209 detecting an abnormal condition and decoupling the capacitor bank 218 from the bus 104. In another embodiment, the trip indicator 212 includes a reset button that, once activated by a user, causes the monitoring device 214 to recouple the capacitor bank 218 to the bus 104 and continue monitoring for abnormal conditions.

As described above, the capacitor system 210 including the housing 210 is utilized in a 3-phase power system; however, in other embodiments, the housing 210 is utilized in a system with fewer than three phases or in a different type of system.

According to some embodiments, the controller 209 is configured to monitor and control operation of each PFC leg 107 in the PFC circuit 100. Using data stored in associated memory, the controller 209 is operable to execute one or more instructions that may result in the manipulation of one or more switches' conductive states. In some examples, the controller 209 includes one or more processors or other types of controllers. The controller 209 may perform a portion of the functions discussed herein on a processor, and perform another portion using an Application-Specific Integrated Circuit (ASIC) tailored to perform particular operations. Examples in accordance with aspects and embodiments described herein may perform the operations described herein using many specific combinations of hardware and software and are not limited to any particular combination of hardware and software components.

Figure 4:
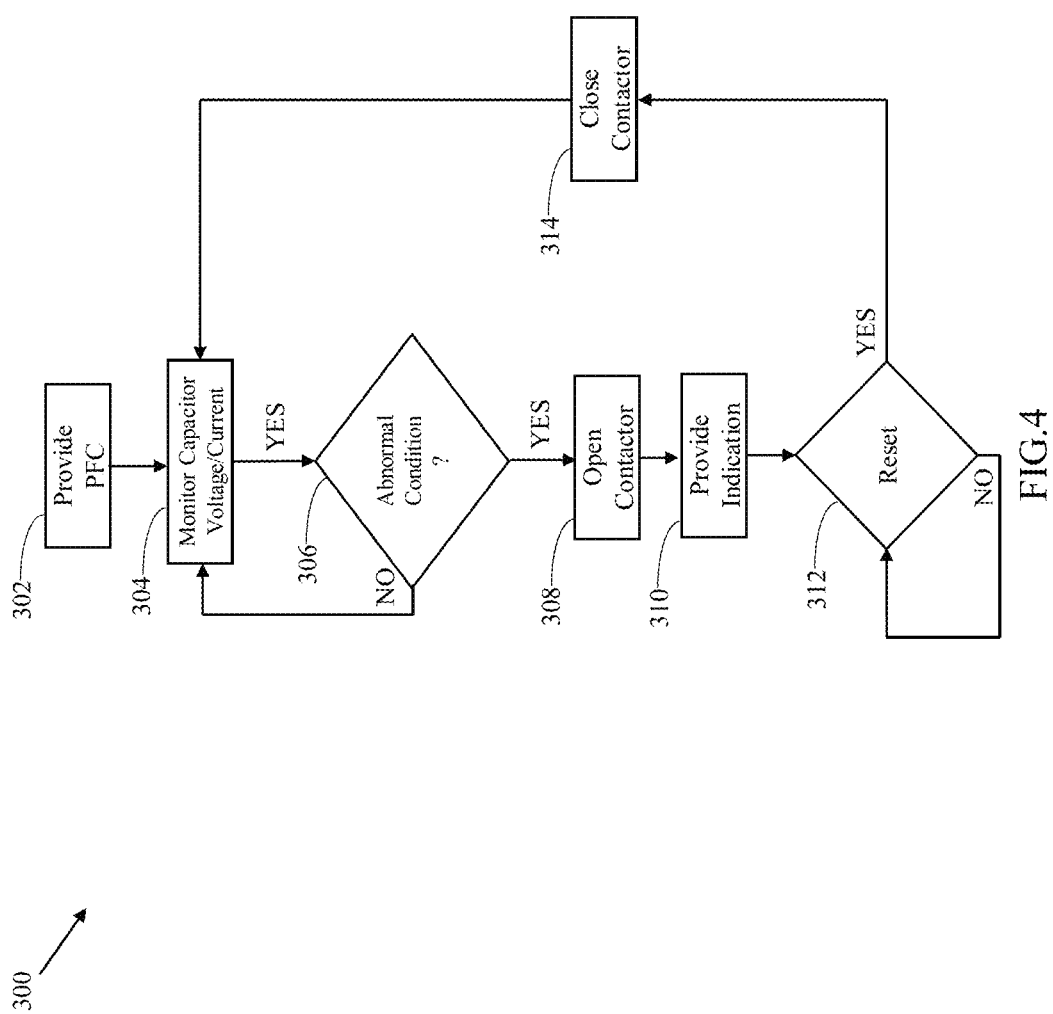
FIG. 4 is a flow chart illustrating operation of monitoring power factor correction in accordance with aspects and embodiments described herein.

FIG. 4 is a flow chart illustrating a method 300 of monitoring one or more capacitors. The method 300 includes the acts 302, 304, 308, 310, and 314, as well as the conditions 306 and 312. According to certain embodiments, the entirety of the method 300, or any subset of acts or conditions thereof are performed by a processor or a controller, including, for example, the controller 209. According to additional embodiments, the entirety of the method 300, or any subset of acts or conditions thereof are performed by the monitoring device 214. Other embodiments include the method 300 being implemented by a combination of the controller 209 and the monitoring device 214.

The method 300 begins with act 302, which operates a PFC circuit, such as the PFC circuit 100 to provide power factor correction to input 3-phase power received by an input of the PFC circuit. For example, in one embodiment, the controller 209 operates the three PFC legs 107 of the PFC circuit 100 illustrated in FIG. 1 to provide power factor correction to input 3-phase power received by the PFC circuit 100.

In act 304, while the PFC circuit 100 is providing power factor correction to the input 3-phase power received by the input 101, the voltage across and/or current provided to one or more capacitors 251,252,253 in the capacitor bank 218 is monitored. In an example, the monitoring device 214 monitors the voltage and/or current. In another example, the monitoring device 214 receives data from the sensor package 216 and provides the data to the controller 209 for monitoring the voltage and/or current.

In one embodiment, the controller 209 and/or the monitoring device 214 determines, at condition 306, if one or more abnormal conditions has occurred based on one or more values of monitored current and/or voltage obtained in act 304. In one embodiment, an abnormal overvoltage condition is identified as existing, at condition 306, in response to identifying that the monitored voltage is greater than a voltage threshold. In another embodiment, an abnormal overcurrent condition is identified as existing, at condition 306, in response to the monitored current being greater than a current threshold. In another embodiment, an abnormal undercurrent condition is identified as existing, at condition 306, in response to identifying that the monitored current is less than a current threshold. If an abnormal condition is not identified, the capacitor system 210 remains coupled to the bus 104 and the controller 209 and/or the monitoring device 214 continues to monitor for abnormal conditions. In response to determining an abnormal condition at the condition 306 (i.e., YES in condition 306), the method 300 proceeds to act 308.

In act 308, in response to the controller 209 and/or the monitoring device 214 identifying the abnormal condition, the corresponding leg contactor of the PFC leg containing the capacitor with the abnormal condition is instructed to open, thereby decoupling the capacitor system 210 from the bus 104. By decoupling the capacitor system 210 from the bus 104 (and preventing power flow to/from the capacitor system 210) in response to a detected abnormal voltage and/or current condition, the lifetime of capacitors in the capacitor system 210 can be preserved and the efficiency of the PFC circuit 100 can be maintained.

According to certain embodiments, upon the abnormal condition being identified and the capacitor system 210 including the capacitor bank 218 being decoupled from the bus 104, the trip indicator 212 is activated in act 310. In one embodiment, the monitoring device 214 or the controller 209 activates the trip indicator 212 (e.g., a visual or audible indicator) to provide a user with an indication of the fault indicated by the identified abnormal condition.

According to additional embodiments, upon the abnormal condition being identified and the capacitor system 210 being decoupled from the bus 104a reset switch/button is monitored, at condition 312, to determine if the reset switch/button has been activated by a user. If the reset switch/button is not activated, the reset switch/button is further monitored for activation while the capacitor system 210 and the capacitor bank 218 remains decoupled from the bus 104. Upon activation of the reset switch or button, the method 300 proceeds to act 314 where the leg contactor that was opened in act 308 is closed, thereby recoupling the PFC leg that experienced the abnormal condition to the bus 104.

In certain embodiments, the controller 209 and/or the monitoring device 214 is configured to control the leg contactor of a different PFC leg in the PFC circuit 100. As an example, as illustrated in FIG. 2, one of the three PFC legs 107 includes the monitoring device 214, which detects an abnormal condition in its respective PFC leg and controls the leg contactor of one or more other PFC legs of the three PFC legs to decouple from the bus 104. Additional embodiments include the monitoring device 214 in one PFC 107 controlling one or more leg contactors in the PFC circuit to recouple to the bus 104. The monitoring device 214 may control the one or more leg contactors directly or instruct the controller 209 to carry out the decoupling or recoupling.

FIG. 5 is a flow chart illustrating a method 400 of monitoring one or more capacitors. The method 400 includes the acts 402, 404, 406, 408, 410, and 414, as well as the conditions 416, 418, 420, 422, 424, 426, and 412. According to certain embodiments, the entirety of the method 400, or any subset of acts or conditions thereof are performed by a processor or a controller, including, for example, the controller 209 and the controller 209. According to additional embodiments, the entirety of the method 400, or any subset of acts or conditions thereof are performed by the capacitor system 210 or the monitoring device 214. Examples of the method 400 include controlling one or more components within the housing 210 and/or the leg contactor 206. Other examples of the method 400 include controlling one or more components of the PFC circuit 100. For the sake of brevity, the method 400 is described where it primarily differs from the discussed above with respect to the method 300. According to certain embodiments, the entirety of the method 400 or any subset of acts or conditions thereof are implemented by the controller 209 and/or the monitoring device 214.

As illustrated in FIG. 5, the method 400 monitors both capacitor voltage in act 404 and capacitor current in act 406. According to other embodiments, the method 400 can include only one of acts 404 and 406 (and their corresponding conditions 416 and 416, or 424 and 426). In each of the conditions 416, 420, 424 a measured value is compared to a predetermined threshold. For example, one or more voltage sensors, at condition 416, determine a voltage across a capacitor within a capacitor bank. If the voltage exceeds a predetermined threshold (i.e., an overvoltage), then the method 400 proceeds to an additional condition 418. In response to any of conditions 416, 420, and 424 being satisfied for a sufficiently long period of time and/or for a sufficient number of samples, an abnormal condition is identified at conditions 418, 420, and 424, respectively.

In an example, a controller, including, the controller 209 and/or the monitoring device 214, determines that a voltage value across one of the capacitors 251,252,253 in the capacitor bank 218 is greater than a predetermined voltage value at condition 416. However, in response to condition 416 being satisfied for only one sample, for example, an overvoltage condition is not indicated, at condition 418, and the capacitor voltage would continue to be monitored in the act 416 until the condition 418 is satisfied for a predetermined number of samples, for example, five samples. In another example, the method 400 only proceeds to act 408 when the voltage is greater than a threshold value of voltage for at least a predetermined period of time, at condition 418.

In another example, the controller 209 and/or the monitoring device 214 determines that a current value provided to one of the capacitors 251,252,253 in the capacitor bank 218 is greater than a predetermined current value at condition 420. However, in response to condition 420 being satisfied for only one sample, for example, an overcurrent condition is not indicated, at condition 422, and the capacitor current would continue to be monitored in the act 420 until the condition 422 is satisfied for a predetermined number of samples, for example, five samples. In another example, the method 400 only proceeds to act 408 when the current is greater than a threshold value of current for at least a predetermined period of time, at condition 422.

In another example, the controller 209 and/or the monitoring device 214 determines that a current value provided to one of the capacitors 251,252,253 in the capacitor bank 218 is less than a predetermined current value at condition 424. However, in response to condition 424 being satisfied for only one sample, for example, an undercurrent condition is not indicated, at condition 426, and the capacitor current would continue to be monitored in the act 406 until the condition 424 is satisfied for a predetermined number of samples, for example, five samples. In another example, the method 400 only proceeds to act 408 when the current is less than a threshold value of current for at least a predetermined period of time, at condition 426. According to additional embodiments, one or more of the conditions 416, 420, and 424 determines an additional condition where the absolute value between the monitored value and the respective threshold must meet or exceed a minimum value. In such embodiments, the subsequent conditions 418, 422, and 426 may have different values than those described above. In an example, the condition 416 determines that the monitored capacitor voltage is not only greater than a predetermined threshold, but greater than the predetermined threshold by a minimum absolute amount value of voltage. Such examples provide additional options to tune the method 400 to a particular application by balancing a tradeoff between how long the monitored value needs to satisfy the conditions of 416, 420, and 424 and how large of a difference with a nominal value can be tolerated. According to some embodiments, larger differences with nominal values in the conditions 416, 420, and 424 require shorter periods of time or numbers of samples in the conditions 418, 422, 426.

Figure 6B:
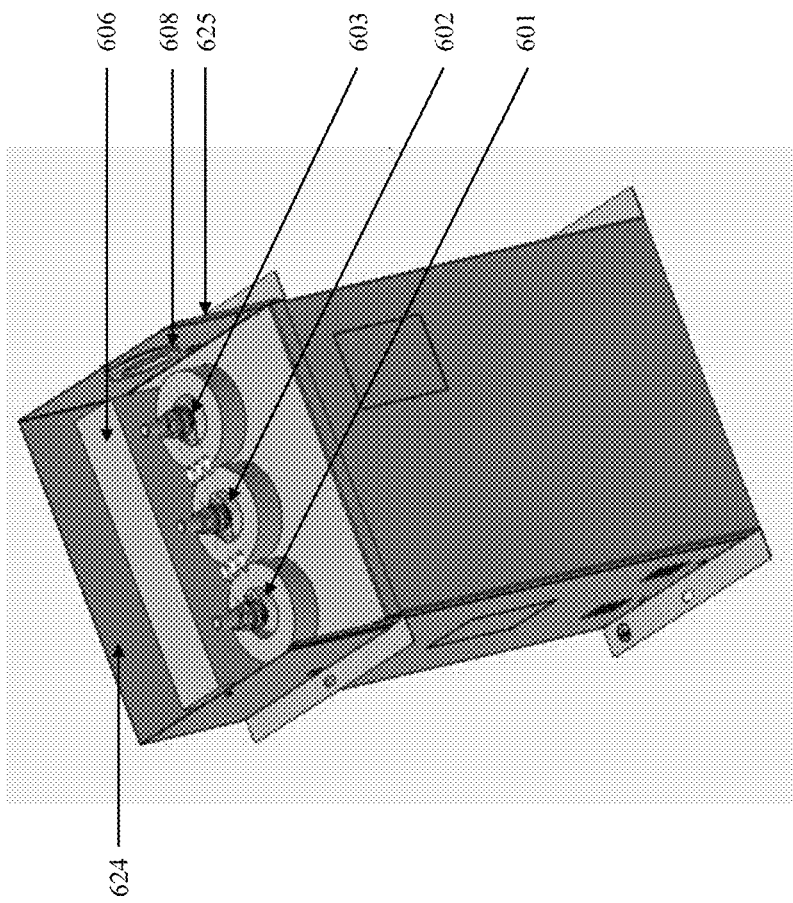
FIG. 6B is a view of the box-type capacitor with a cover removed and terminals exposed in accordance with aspects and embodiments described herein.
Figure 6C:
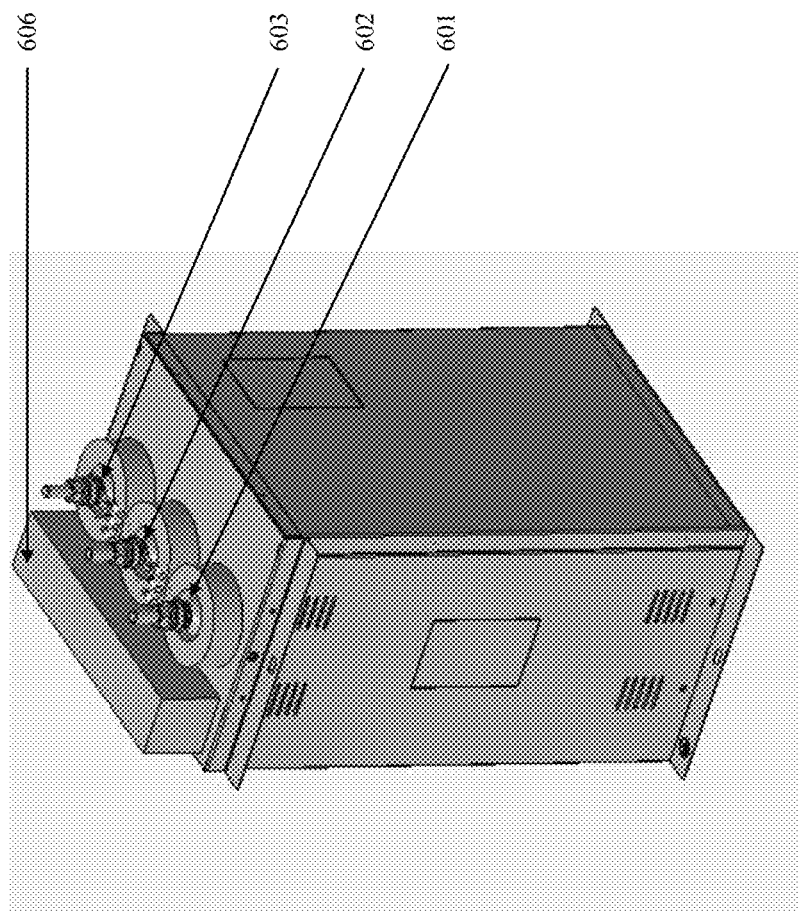
FIG. 6C is a view of the box-type capacitor with additional panels removed in accordance with aspects and embodiments described herein.

One embodiment of a smart capacitor system 610 (e.g., similar to the smart capacitor system 210) is shown in FIGS. 6A, 6B, and 6C. The capacitor system 610 is a box-type capacitor. However, additional embodiments include other types of capacitors including, but not limited to, can-type capacitors. The capacitor system 610 includes a cover, which includes a first panel 621, a second panel 622, a third panel 623, a fourth panel 624, and a fifth panel 625, each panel can be removable for more access to the internal components. As illustrated in FIG. 6B, the fifth panel 625 includes a grommet 608, which allows one or more power cables to pass through.

Also included in the capacitor system 610 is a first terminal 601, a second terminal 602, and a third terminal 603, each terminal being adjacent to a region 606. Similar to the PFC circuit 100, each of the terminals 601,602,603 is configured to be part of a PFC circuit (not shown) and connected to one of three power lines (e.g., similar to the bus lines 104, the phase lines 102, or some other power lines), which are each configured to be connected to a separate PFC leg (e.g., similar to the PFC leg 107). One or more of the internal components of the capacitor system 610 may be located within the region 606. In an example, the region 606 includes a monitoring device (e.g., similar to the monitoring device 214) that is adjacent and connected to the terminals 601,602,603. For example, the monitoring device can include current sensors and/or voltage sensors which are arranged to monitor the terminals for the one or more conditions as described herein. According to certain embodiments, the monitoring device is externally connected to the internal capacitors of the capacitor system 610 as a stand-alone unit.

Embodiments of the capacitor systems 110,210,610 include reactive power ratings ranging from 2.5 KVAR to 100 KVAR, rated voltages ranging from 240 V to 830 V, and network frequencies including 50 Hz and 60 Hz. It is contemplated that the monitoring device may be incorporated into any number, size, and type of capacitors, including any obvious variants thereof.

As described above, a power factor correction circuit is provided that is capable of detecting an abnormal voltage and/or current condition in a three-phase system, and as a result, operating a contactor to prevent power flow to capacitors in the capacitor bank of the power factor correction circuit. By preventing power flow from the contactor to the capacitors in response to detecting an abnormal condition, the lifetime of the capacitors in the capacitor bank can be preserved and the efficiency of the system can be maintained.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of aspects and embodiments described herein. Accordingly, the foregoing description and drawings are by way of example only

What is claimed is:

1. A capacitor system comprising:
   a housing including:
   at least one capacitor configured to be coupled to a first bus line and a second bus line, the at least one capacitor configured to receive a first phase of power from the first bus line and receive a second phase of power from the second bus line, the second phase of power being different than the first phase of power;
   at least one sensor configured to be coupled to the first bus line and configured to measure at least one electrical parameter of the at least one capacitor; and
   a monitoring device configured to monitor the at least one electrical parameter, identify one or more conditions of the at least one capacitor based on the at least one electrical parameter and operate a contactor to decouple the at least one capacitor from the first bus line and the second bus line in response to identifying the one or more conditions.

2. The capacitor system of claim 1, wherein the at least one sensor includes a voltage sensor coupled to the at least capacitor and the at least one parameter includes a voltage across the at least one capacitor.

3. The capacitor system of claim 2, wherein the one or more conditions include the voltage exceeding a predetermined value for one of at least a number of samples and at least a period of time.

4. The capacitor system of claim 1, wherein the at least one sensor includes a current sensor coupled to the at least one capacitor and configured to measure current provided to the at least one capacitor.

5. The capacitor system of claim 4, wherein the one or more conditions include the current exceeding a predetermined value for one of at least a number of samples and at least a period of time.

6. The capacitor system of claim 5, wherein the one or more conditions include the current being less than a second predetermined value for one of at least a number of samples and at least a period of time.

7. The capacitor system of claim 1, wherein in operating the contactor to decouple the at least one capacitor from the first bus line and the second bus line, the monitoring device is further configured to directly operate the contactor to open.

8. The capacitor system of claim 1, wherein in operating the contactor to decouple the at least one capacitor from the first bus line and the second bus line, the monitoring device is further configured to transmit a signal to a controller, the controller configured to operate the contactor to open in response to receiving the signal.

9. The capacitor system of claim 1, further comprising:
   a trip indicator including a reset button configured to be activated to recouple the at least one capacitor to the first bus line and the second bus line for the monitoring device to continue monitoring for the one or more conditions,
   wherein the monitoring device is further configured to transmit a signal to the trip indicator in response to identifying the one or more conditions.

10. The capacitor system of claim 1, wherein the at least one sensor includes a voltage sensor coupled to the at least one capacitor and configured to measure a voltage across the at least one capacitor, and a current sensor coupled to the at least one capacitor and configured to measure current provided to the at least one capacitor;
   the at least one parameter includes the voltage and the current;
   the one or more conditions include an overvoltage, an overcurrent, and an undercurrent; and
   the monitoring device is further configured to:
   detect the voltage exceeds the predetermined value for one of at least a number of samples and at least a period of time, and identify the overvoltage;
   detect the current exceeds a second predetermined value for one of at least a number of samples and at least a period of time, and identify the overcurrent; and
   detect the current is less than a third predetermined value for one of at least a number of samples and at least a period of time, and identify the undercurrent.

11. A method of operating a capacitor system including a housing, the housing including at least one capacitor, at least one sensor, and a monitoring device, the method comprising:
   coupling the at least one capacitor to a first bus line and a second bus line;
   coupling the at least one sensor to the first bus line;
   coupling the at least one capacitor to the at least one sensor;
   providing a first phase of power to the first bus line;
   providing a second phase of power to the second bus line, the second phase of power being different than the first phase of power;
   measuring, with the at least one sensor, at least one electrical parameter of the at least one capacitor;
   monitoring, with the monitoring device, the at least one electrical parameter;
   identifying one or more conditions of the at least one capacitor based on the at least one electrical parameter; and
   operating a contactor to decouple the at least one capacitor from the first bus line and the second bus line in response to identifying the one or more conditions.

12. The method of claim 11, further comprising:
   coupling the at least one sensor to the at least one capacitor;
   wherein measuring the at least one parameter includes measuring a voltage across the at least one capacitor; and
   determining the voltage exceeds a predetermined value for one of at least a number of samples and at least a period of time;
   wherein identifying the one or more conditions includes identifying an overvoltage.

13. The method of claim 11, further comprising:
   coupling the at least one sensor to the at least one capacitor;
   wherein measuring the at least one parameter includes measuring a current provided to the at least one capacitor; and
   determining the current exceeds a predetermined value for one of at least a number of samples and at least a period of time;
   wherein identifying the one or more conditions includes identifying an overcurrent.

14. The method of claim 11, further comprising:
   coupling the at least one sensor to the at least one capacitor;

wherein measuring the at least one parameter includes measuring a current provided to the least one capacitor; and
determining the current is less than a predetermined value for one of at least a number of samples and at least a period of time;
wherein identifying the one or more conditions includes identifying an undercurrent.

15. The method of claim 11, wherein operating the contactor to decouple the at least one capacitor from the first bus line and the second bus line includes directly operating the contactor to open with the monitoring device.

16. The method of claim 11, wherein operating the contactor to decouple the at least one capacitor from the first bus line and the second bus line includes transmitting a signal from the monitoring device to a controller, and operating, with the controller in response to receiving the signal, the contactor to open.

17. The method of claim 11, further comprising:
in response to identifying the one or more conditions, transmitting a signal to a trip indicator included in the capacitor system, the trip indicator including a reset button;
in response to receiving the signal, activating the trip indicator; and
in response to the reset button being activated, recoupling the smart capacitor system to the first bus line and the second bus line and continuing to monitor for the one or more conditions.

18. A Power Factor Correction (PFC) circuit comprising:
a controller;
an input configured to be coupled to a 3-phase power source and to receive input 3-phase power from the 3-phase power source;
at least one bus line configured to carry the input 3-phase power;
a PFC leg including a contactor and a capacitor system, the contactor coupled to the controller and configured to selectively couple the capacitor system to the at least one bus line, and the capacitor system including:

a housing including:
at least one capacitor configured to be coupled to the at least one bus line;
at least one sensor configured to measure at least one electrical parameter of the at least one capacitor; and
a monitoring device configured to monitor the at least one electrical parameter, identify one or more conditions of the at least one capacitor based on the at least one electrical parameter, and operate the contactor to decouple the at least one capacitor from the at least one bus line in response to identifying the one or more conditions.

19. The PFC circuit of claim 18, further comprising:
a trip indicator including a reset button configured to be activated to recouple the at least one capacitor to the at least one bus line and continue monitoring for the one or more conditions,
wherein the monitoring device is further configured to transmit a signal to the trip indicator in response to identifying the one or more conditions.

20. The PFC circuit of claim 18, wherein the at least one sensor includes a voltage sensor coupled to the at least one capacitor and configured to measure a voltage across the at least one capacitor, and a current sensor coupled to the at least one capacitor and configured to measure current provided to the at least one capacitor;
the at least one parameter includes the voltage and the current;
the one or more conditions include an overvoltage, an overcurrent, and an undercurrent; and
the monitor is further configured to:
detect the voltage exceeds the predetermined value for one of at least a number of samples and at least a period of time, and identify the overvoltage;
detect the current exceeds a second predetermined value for one of at least a number of samples and at least a period of time, and identify the overcurrent; and
detect the current is less than a third predetermined value for one of at least a number of samples and at least a period of time, and identify the undercurrent.

* * * * *